(12) United States Patent
Vashchenko et al.

(10) Patent No.: US 7,075,341 B1
(45) Date of Patent: Jul. 11, 2006

(54) LOW AREA LINEAR TIME-DRIVER CIRCUIT

(75) Inventors: Vladislav Vashchenko, Palo Alto, CA (US); Yuri Mirgorodski, Sunnyvale, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/823,455

(22) Filed: Apr. 13, 2004

(51) Int. Cl.
*H03B 1/00* (2006.01)
(52) U.S. Cl. .................... 327/108; 327/143; 327/427
(58) Field of Classification Search .......... 327/77–81, 327/108, 427, 143, 198, 309, 318, 324; 361/56, 361/83, 89, 91.1, 93.9, 94; 320/166
See application file for complete search history.

(56) References Cited

U.S. PATENT DOCUMENTS 5,721,502 A * 2/1998 Thomson et al. ........... 327/143
6,710,634 B1 * 3/2004 Ohbayashi et al. ......... 327/143

\* cited by examiner

*Primary Examiner*—Long Nguyen
(74) *Attorney, Agent, or Firm*—Stallman & Pollock LLP

(57) ABSTRACT

A linear time-driver circuit is provided that consumes low space on-chip. The time-driver circuit is based upon the small capacitor charge of the merged region of a 5V tolerant cascaded NMOS device, a single gate device and a zener diode.

2 Claims, 3 Drawing Sheets

LOW AREA LINEAR TIME-DRIVER CIRCUIT

TECHNICAL FIELD

The present invention provides a low space consuming linear time-driver circuit that is based upon the small capacitor charge of the merged region of a 5V tolerant cascoded NMOS device, a single gate device and a zener diode.

DESCRIPTION OF THE INVENTION

Time-driver circuits are one of the important elements for the active clamps used in electrostatic discharge (ESD) protection circuits. Because simple, but space-consuming RC-timers are typically used in these ESD application, the drivers are typically implemented as corner cells in the overall circuit layout. As a result, the timer time domain is limited by 6–8 usec.

Figure 1A:
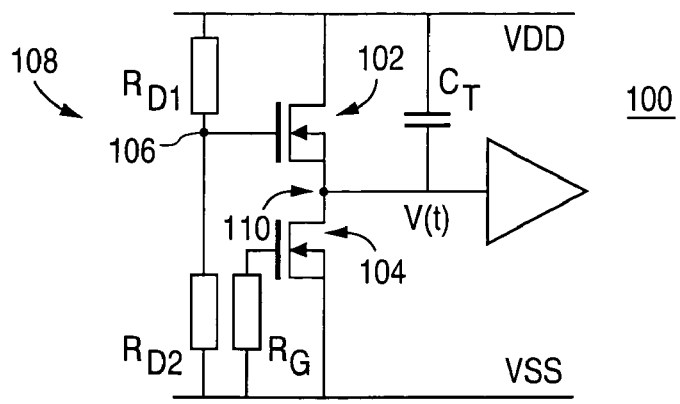
FIG. 1A is a circuit schematic illustrating a time-driver circuit in accordance with the concepts of the present invention that utilizes a cascoded NMOS design.
Figure 1B:
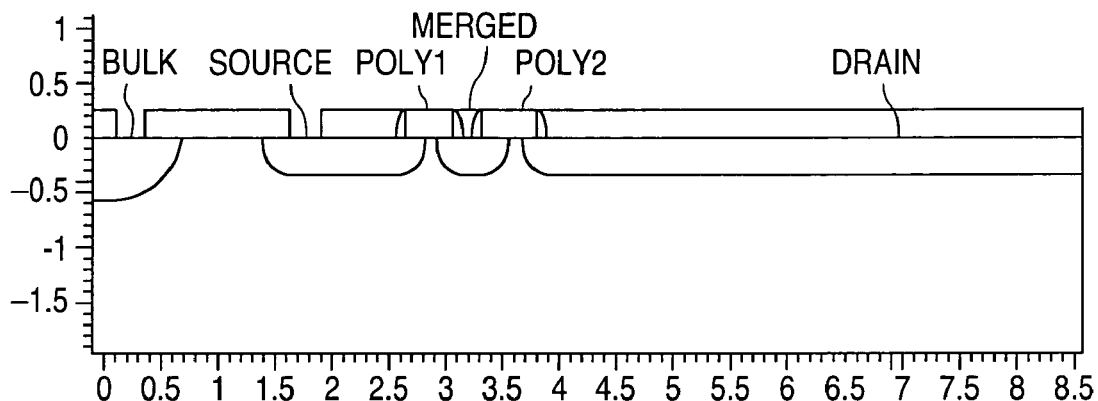
FIG. 1B is a partial cross-section drawing of an emodiment of the FIG. 1A circuit taken along the cascoded NMOS device structure of FIG. 1A.

FIG. 1A shows a time-driver circuit 100 in accordance with the concepts of the present invention that utilizes a cascoded NMOS design. FIG. 1B shows a cross-section of an embodiment of the FIG. 1A time-driver circuit taken along the cascoded NMOS structure of the FIG. 1A circuit 100.

The FIG. 1 circuit 100 includes cascoded NMOS devices 102 and 104 connected between a positive voltage supply $V_{DD}$ and a negative voltage supply $V_{SS}$. The gate of the lower NMOS device 104 is connected to the negative voltage supply $V_{SS}$ by a resistor $R_G$. The gate of the upper NMOS transistor 102 is connected to the common node of a resistive divider 108 that includes resistor $R_{D1}$ and resistor RD2. The merged (common) node 110 of the cascoded NMOS devices 102 and 104 provides a capacitive charge $C_T$ that is disposed between the cascoded structure common node 110 and the positive voltage supply $V_{DD}$.

Evaluation of the circuit 100 shown in FIG. 1B has demonstrated that a linear voltage dependence is produced in a wide range of parameters under extremely small component values. The cascoded NMOS device utilized for the FIG. 1B test circuit was taken at w=10 microns. The millisecond range is achieved for a capacitor value $C_T$ of about 100 fF only.

The output node voltage V(t) of the circuit is supposed to be loaded on the circuit starting with the low equivalent capacitance input realized by minimum dimension devices.

The operational principle of the circuit is as follows. Under initial conditions, $V_{DD}$=0, the capacitor $C_T$ is discharged and the potential of the cascoded structure common node 110 is equal to $V_{DD}$=0. The gate potential of the lower NMOS device 104 is also zero. The gate potential of the upper NMOS device 104 is defined by the ratio $R_{D1}/R_{D2}$ of the resistive divider 108. After the positive supply $V_{DD}$ is applied and a fast current through the parasitic capacitance $C_T$ of the device, the potential of the merged cascoded structure common node 110 starts to change due to the charge of the capacitor $C_T$. The gate potential of the lower NMOS device 104 remains zero. The gate potential of the upper NMOS device 102 is defined by the ration $R_{D1}/R_{D2}$ of the resistive divider 108 and is lower than the potential of the cascoded structure common node 110. Thus, both NMOS devices 1–2 and 104 are in the off state. The capacitor $C_T$ continues to charge by the leakage current through the upper NMOS device 102 until equilibrium is defined by the gate potentials.

Figure 1C:
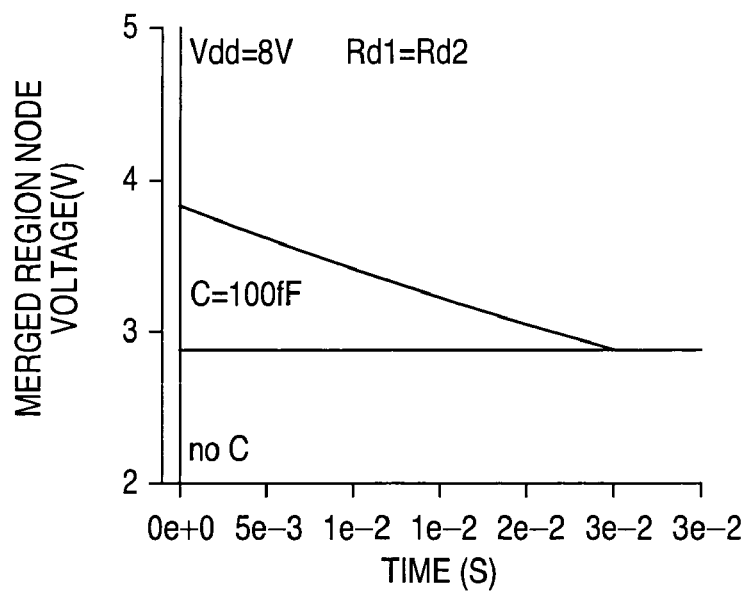
FIGS. 1C and 1D are graphs illustrating merged region node voltage over time for various capacitor values for the FIG. 1A/1B circuit.
Figure 1D:
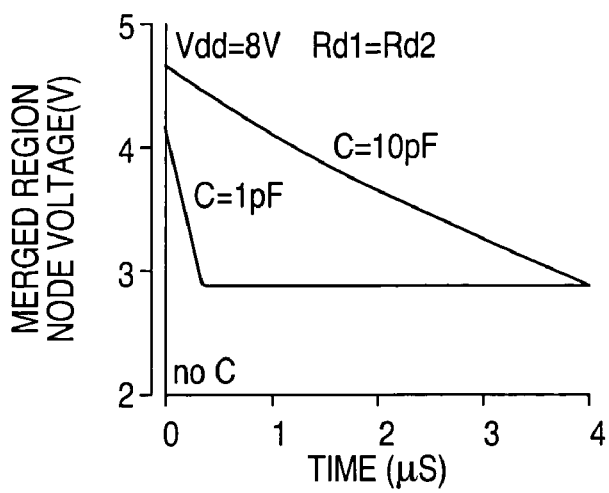

FIGS. 1C and 1D are graphs showing voltages of the merged cascoded structure common node 110 over time for various capacitor values $C_T$ for the FIG. 1A/1B circuit.

Figure 2A:
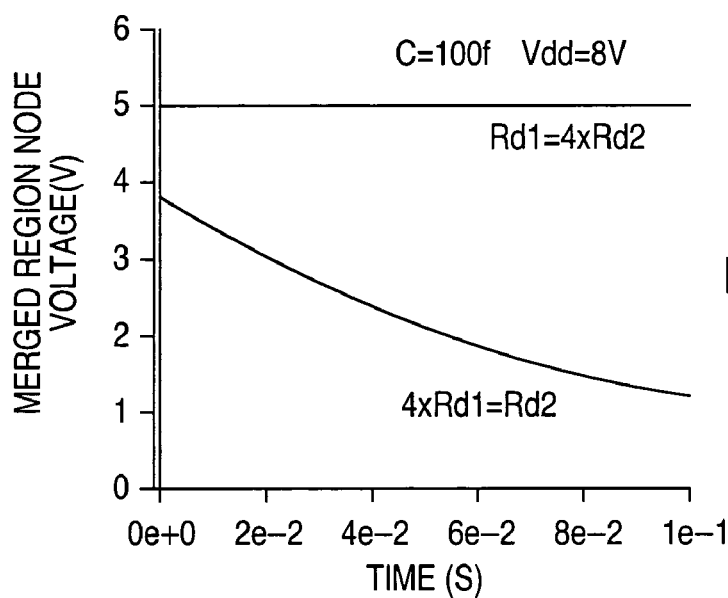
FIGS. 2A and 2B are graphs illustrating the calculated transient characteristic for merged region node voltage as a function of the capacitor, the gate resistive divider ratio and the $V_{DD}$ level for the FIG. 1A circuit.
Figure 2B:
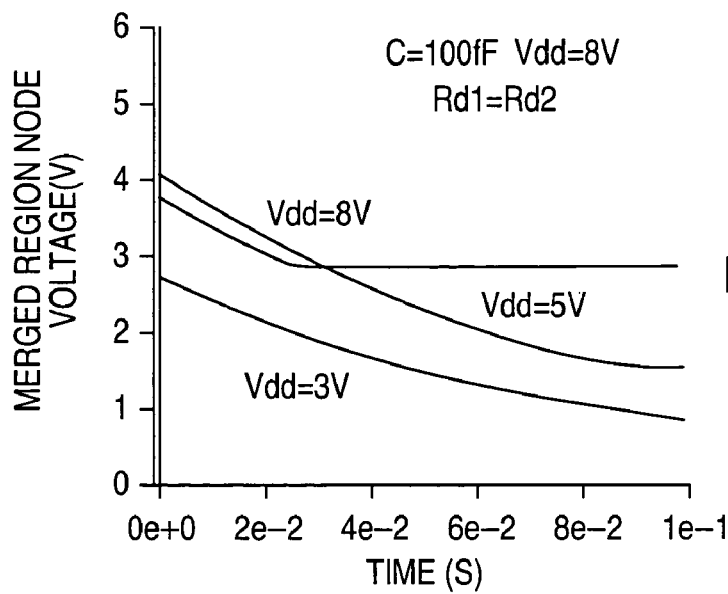

FIGS. 2A and 2B are graphs that illustrate the calculated transient characteristics for the merged region node voltage as a function of the capacitor $C_T$, the gate resistive divider ratio $R_{D1}/RD2$ and the $V_{DD}$ level for the FIG. 1A/1B circuit.

Figure 3A:
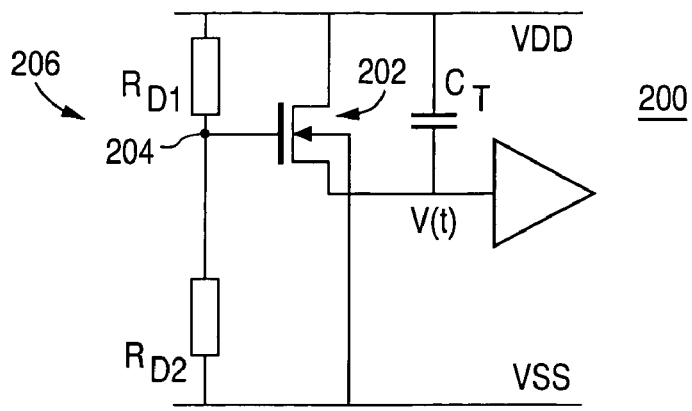
FIG. 3A is a circuit schematic illustrating a time-driver circuit in accordance with the concepts of the present invention that utilizes a non-cascoded NMOS design.
Figure 3B:
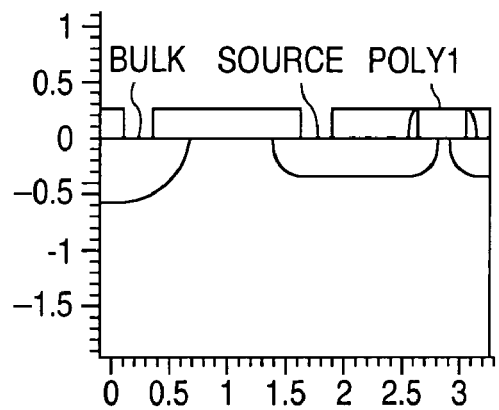
FIG. 3B is a partial cross section drawing of an embodiment of an NMOS device in the FIG. 3 circuit.

Those skilled in the art will appreciate that similar principles can be realized for a 3.3V or lower tolerant voltage based on a non-cascoded NMOS design, as shown in FIG. 3A. FIG. 3B shows a cross-section of an embodiment of an NMOS device 202 in the FIG. 3A circuit 200.

The FIG. 3A circuit 200 includes an NMOS device 202 that is connected between a positive supply $V_{DD}$ and a negative supply $V_{SS}$. The gate of the NMOS device 202 is connected to the common node 204 of a resistive divider 206 that includes a resistor $R_{D3}$ that is connected between the positive supply $C_{DD}$ and the resistive divider common node 204 and a resistor $R_{D4}$ that connected between the resistive divider common node 204 and the negative supply $V_{SS}$. As in the case of the cascoded NMOS design discussed above in conjunction with FIGS. 1A/1B, a capacitor $C_T$ is connected between the output V(t) of the NMOS device 202 and the positive supply $V_{DD}$.

Figure 4:
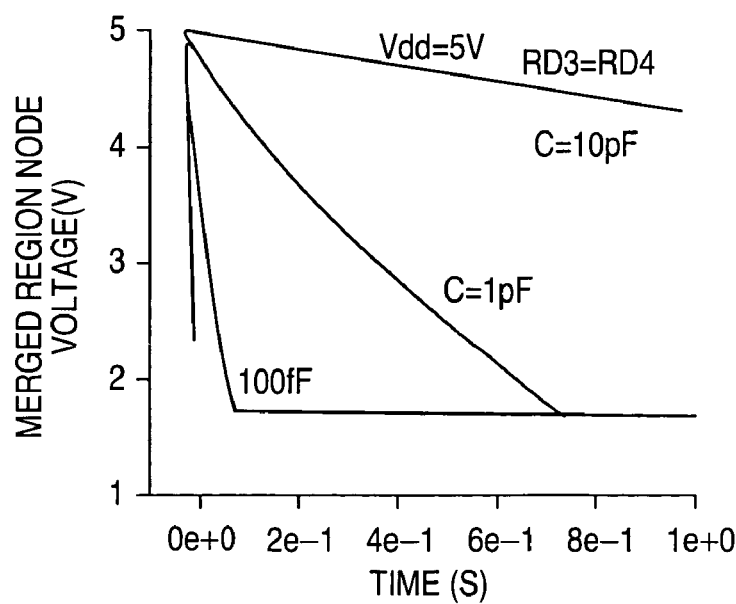
FIG. 4 is a graph illustrating the calculated transient characteristic for the merged region node voltage as a function of the capacitor, the gate resistive divider ratio and the $V_{DD}$ level for the FIG. 3A circuit.

FIG. 4 is a graph that shows the calculated transient characteristic for the merged region node voltage as a function of the capacitor $C_T$, the resistive divider ratio $R_{D3}/R_{D4}$ and the $V_{DD}$ level for the FIG. 3A non-cascoded circuit 200.

It should be understood that various alternatives to the embodiments of the invention described herein may be employed in practicing the invention. It is intended that the following claims define the scope of the invention and structures and methods within the scope of these claims and their equivalence be covered thereby.

What is claimed is:

1. A time-driver circuit comprising:
   a resistive divider that includes a first resistor having a first end connected to a positive voltage supply and a second end connected to a resistive divider common node, and a second resistor having a first end connected to a negative voltage supply and a second end connected to the resistive divider common node;

a cascoded transistor structure that includes a first NMOS transistor having its drain connected to the positive supply voltage, its source connected to a common cascoded structure node and its gate connected to the resistive divider common node, and a second NMOS transistor having its drain connected to the common cascoded structure node, its source connected to the negative voltage supply and its gate connected to the negative voltage supply via a third resistor; and a capacitor structure disposed between the common cascoded structure node and the positive voltage supply.

2. A time-driver circuit as in claim 1, and wherein the value $C_T$ of the capacitor structure is about $C_T$=100 fF.

* * * * *